United States Patent
Yurgil

(10) Patent No.: US 7,081,761 B2
(45) Date of Patent: Jul. 25, 2006

(54) ULTRACAPACITOR USEFUL LIFE PREDICTION

(75) Inventor: James R. Yurgil, Livonia, MI (US)

(73) Assignee: General Motors Corporation, Detroit, MI (US)

(*) Notice: Subject to any disclaimer, the term of this patent is extended or adjusted under 35 U.S.C. 154(b) by 0 days.

(21) Appl. No.: 10/891,474

(22) Filed: Jul. 14, 2004

(65) Prior Publication Data

US 2006/0012378 A1 Jan. 19, 2006

(51) Int. Cl.
*G01R 31/12* (2006.01)
*G01N 27/416* (2006.01)

(52) U.S. Cl. ............ 324/548; 324/426; 324/427; 324/430; 324/434

(58) Field of Classification Search ............ 324/548, 324/426, 434, 427, 430, 678; 320/166, 167, 320/132, 149; 702/63; 374/102, 103
See application file for complete search history.

(56) References Cited

U.S. PATENT DOCUMENTS

| | | | | |
|---|---|---|---|---|
| 4,947,123 A | * | 8/1990 | Minezawa | 324/427 |
| 5,394,089 A | * | 2/1995 | Clegg | 324/427 |
| 6,137,292 A | * | 10/2000 | Hirsch et al. | 324/427 |
| 6,642,719 B1 | * | 11/2003 | Seto | 324/427 |
| 6,842,708 B1 | * | 1/2005 | Odaohhara | 702/63 |
| 6,880,967 B1 | * | 4/2005 | Isozumi et al. | 374/102 |

* cited by examiner

*Primary Examiner*—Anjan Deb
*Assistant Examiner*—John Zhu
(74) *Attorney, Agent, or Firm*—Christopher DeVries

(57) ABSTRACT

Methods and apparatus are provided for projecting the useful life $Y_{proj}$ of an ultracapacitor undergoing at least one ON period after an OFF period. The apparatus comprises sensors coupled to the ultracapacitor for measuring the instantaneous voltage V(t) and temperature T(t) thereof as a function of time t, and a measuring system coupled to the sensors, the measuring system receiving V(t), T(t) and computing $Y_{proj}$ based at least in part on combining values of the instantaneous ultracapacitor life $Y(V(t),T(t))=10^{(aT+bV+c)}$ where a, b and c are constants, for different values of t. The measuring system preferably includes program, temporary and non-volitile memory, a processor, a timer and an I/O for communicating with the sensors and other vehicle systems. In a preferred embodiment, values of V(t), T(t) at the beginning and end of the OFF period are also used in determining $Y_{proj}$.

13 Claims, 4 Drawing Sheets

ULTRACAPACITOR USEFUL LIFE PREDICTION

TECHNICAL FIELD

The present invention generally relates to electrical energy sources, and more particularly, to prediction of the remaining operating life of ultracapacitor electrical energy sources.

BACKGROUND

Ultracapacitors are of interest as primary electrical energy storage devices for vehicles and other functions. In such applications it is important to be able to anticipate the remaining useful life of the ultracapacitor energy storage device. FIG. 1 shows plot 10 of the instantaneous projected life Y(T,V) of an ultracapacitor cell as a function of the cell voltage V for different cell temperatures T, where line 11 corresponds to 15 degrees Celsius, line 12 to 25 degrees Celsius, line 13 to 35 degrees Celsius, line 14 to 45 degrees Celsius, line 15 to 55 degrees Celsius, and line 16 to 65 degrees Celsius, respectively. Lines 11–16 of plot 10 can be expressed as:

$$Y(V,T) = 10^{(aT+bV+c)} \quad [1]$$

where a, b, and c are constants. When Y(T,V) is expressed in years, V in volts and T in degrees Celsius, then a=−0.03333333, and b=−3.33333333 and c=10.1666666666 are useful values. While the above expression is useful in providing a snapshot of projected lifespan for a variety of specific cell conditions, it does not reflect a projected life based on the cumulative effects of history of operation, nor present time varying cell conditions. Further, neither FIG. 1, nor the expression it represents, define the method for forecasting the remaining operating life of an ultracapacitor at any current intermediate point in its lifespan. Thus a need continues to exist for an improved means and method for forecasting the remaining life of an ultracapacitor power source, especially as a power source for vehicles.

Accordingly, it is desirable to provide an improved means and method for determining the projected lifespan of an ultracapacitor power source, especially for ultracapacitor types useful for vehicle propulsion. In addition, it is desirable that the means and method be automatic, not requiring any participation by the vehicle user. Still further it is desirable that the system and method of the present information store information on past vehicle operating conditions so that the cumulative impact thereof can be evaluated. Furthermore, other desirable features and characteristics of the present invention will become apparent from the subsequent detailed description and the appended claims, taken in conjunction with the accompanying drawings and the foregoing technical field and background.

BRIEF SUMMARY

An apparatus is provided for projecting the useful life $Y_{proj}$ of an ultracapacitor undergoing at least one ON period after an OFF period. The apparatus comprises sensors coupled to the ultracapacitor for measuring the voltage V(t) and temperature T(t) thereof as a function of time t; and a measuring system coupled to the sensors, the measuring system receiving V(t), T(t) and computing $Y_{proj}$ based at least in part on combining values of the instantaneous ultracapacitor life $Y(V(t),T(t))=10^{(aT+bV+c)}$ where a, b and c are constants, for different values of t during at least the ON period. In a preferred embodiment the measuring system comprises non-volatile memory for storing intermediate values of V(t), T(t) and Y(V,T), program memory, temporary memory and a CPU for performing the various calculations. An I/O interfaces the measuring system to the sensors and other vehicle systems. A method is provided for determining a projected $Y_{proj}$ life of an ultracapacitor utilizing its measured voltage V(t) and measured temperature T(t). The method comprises storing values of V,T for at least two time intervals $t_s$ and determining the instantaneous life of the ultracapacitor $Y(V,T)=10^{(aT+bV+c)}$ where a, b, and c are constants, for the least two time intervals $t_s$ and combining the values of Y(V,T) obtained thereby to at least in part, obtain $Y_{proj}$. In a preferred embodiment, values of V(t), T(t) at the beginning and end of the OFF period are also used in determining $Y_{proj}$. $Y_{proj}$ is preferably obtained by integration and or summation of intermediate values.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description. The words "idle" or "idle state" or "idle period" or "OFF" are used interchangeably herein to indicate the state or period where no significant power is being drawn from the ultracapacitor and the words "run" or "run-state" or "run period" or "ON" are used interchangeably to indicate that significant power is being drawn from the ultracapacitor.

Figure 1:
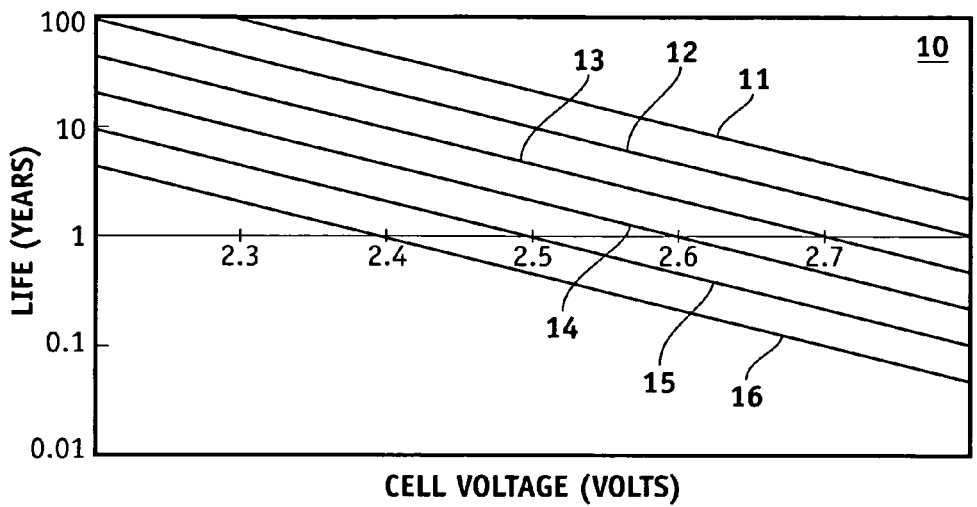
FIG. 1 is a simplified plot of the instantaneous ultracapacitor predicted life in years versus cell voltage in volts, with temperature in degrees Celsius as a parameter, according to the prior art.
Figure 2:
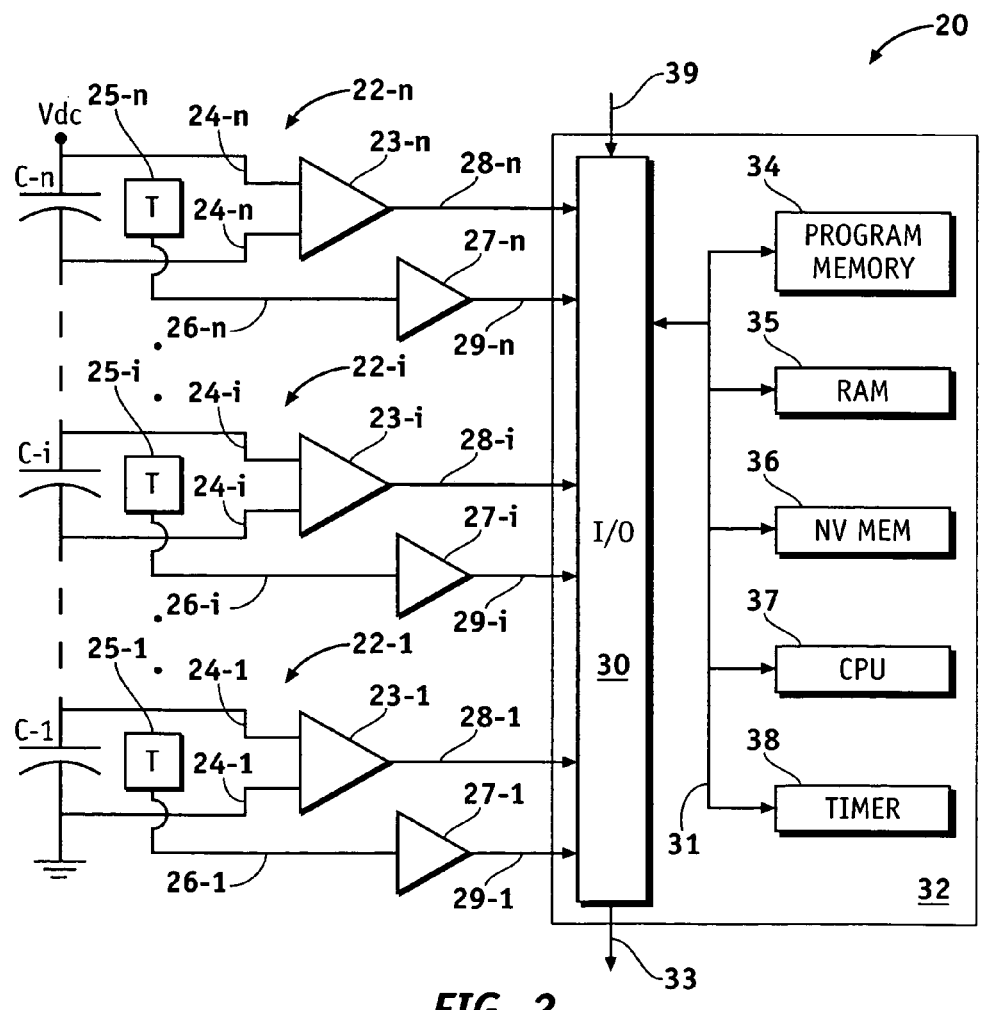
FIG. 2 is a simplified electrical schematic block diagram of the present invention according to a first embodiment.
Figure 6:
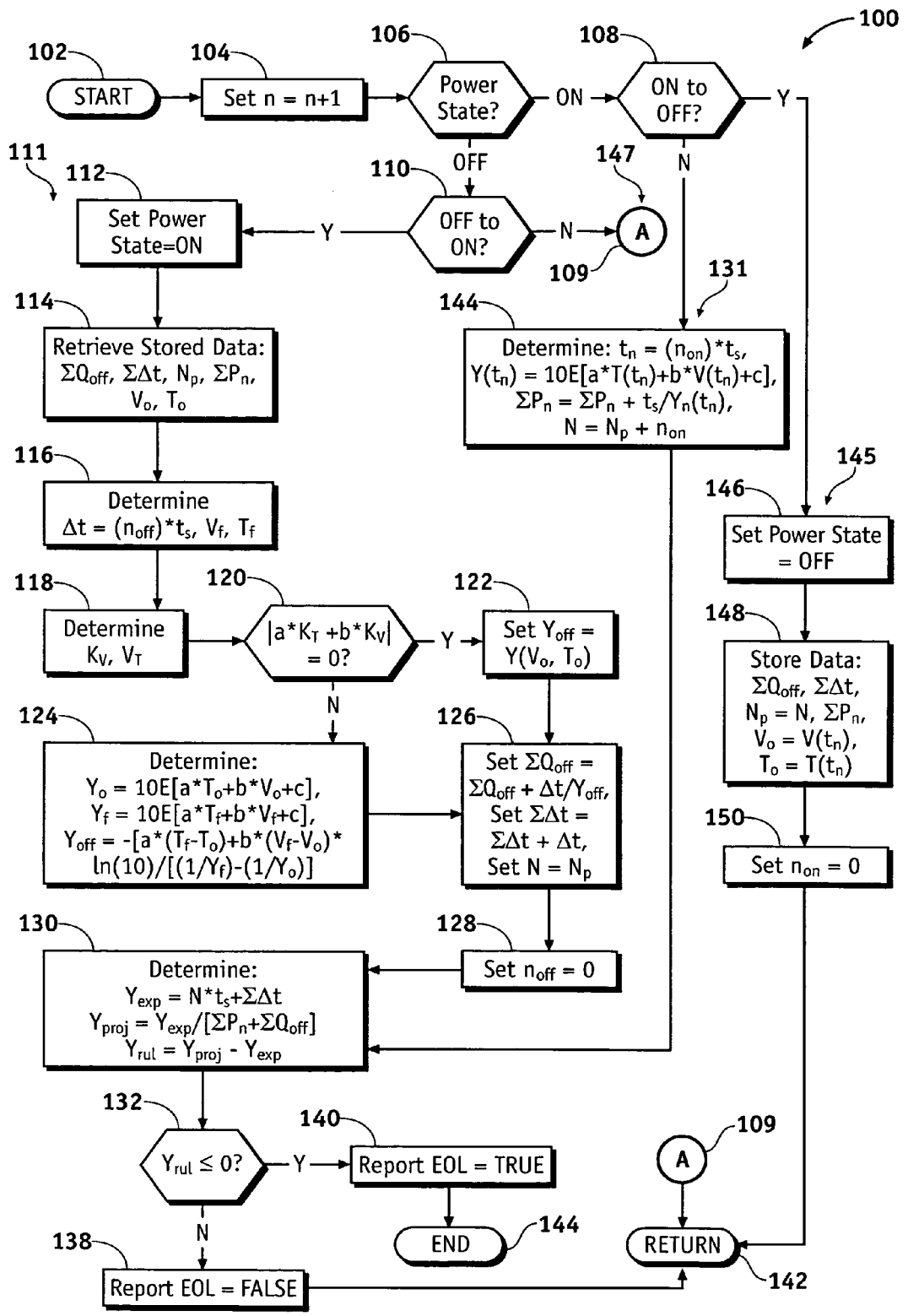
FIG. 6 is a simplified flow chart illustrating the method of the present invention according to a preferred embodiment.

FIG. 2 shows a simplified electrical schematic block diagram of electrical system 20 for determining the projected life of an ultracapacitor, according to a first embodiment of present invention. System 20 comprises one or more ultracapacitors C1 ... Ci ... Cn and capacitor status sensors 22-1 ... 22-i ... 22-n that measure the voltage Vi across each capacitor C-i and temperature Ti of each capacitor Ci. For convenience of explanation, the arrangement is described in terms of a representative capacitor C and a representative status sensor 22, with the subsidiary identification "i" omitted. Each status sensor 22 comprises isolation differential amplifier and level shifter 23 (hereafter isolator 23) having differential voltage inputs 24 coupled across capacitor C, and level shifting amplifier 27 (hereafter isolator 27) having input 26 coupled to temperature sensor 25, which is thermally coupled to capacitor C so as to measure the temperature thereof. The output of isolator 23 on lead or bus 28 and the output of isolator 27 on lead or bus 29 are coupled to I/O 30 of measuring system 32. I/O 30 may be an analog to digital converter (A/D) and or a digital converter or signal translator depending upon the nature of the output signals from isolators 23, 27. Either arrangement is useful. Measuring system 32 further comprises program memory 34, temporary working memory (RAM) 35, non-volatile memory (NV-MEM) 36, processor (CPU) 37, and timer 38, coupled to each other and to I/O 30 via bus 31. Program steps illustrated, for example, in connection with the flow chart of FIG. 6 are stored in memory 34 and cause processor 37 to execute the steps of the method of the present invention. NV-MEM 36 is used to temporarily store intermediate values of various variables or parameters. Output bus or link 33 is provided through which system 20 can communicate the results of its evaluation of the status of capacitors C1 . . . Ci . . . Cn and the predicted life and/or any desired intermediate values to one or more displays, alarm functions, and/or other overall or supervisory vehicle functions (not shown). Input link 39 is provided so that power-up and power-down signals can be received from, for example, the ignition switch (not shown) or other vehicle or power source control device.

Figure 3:
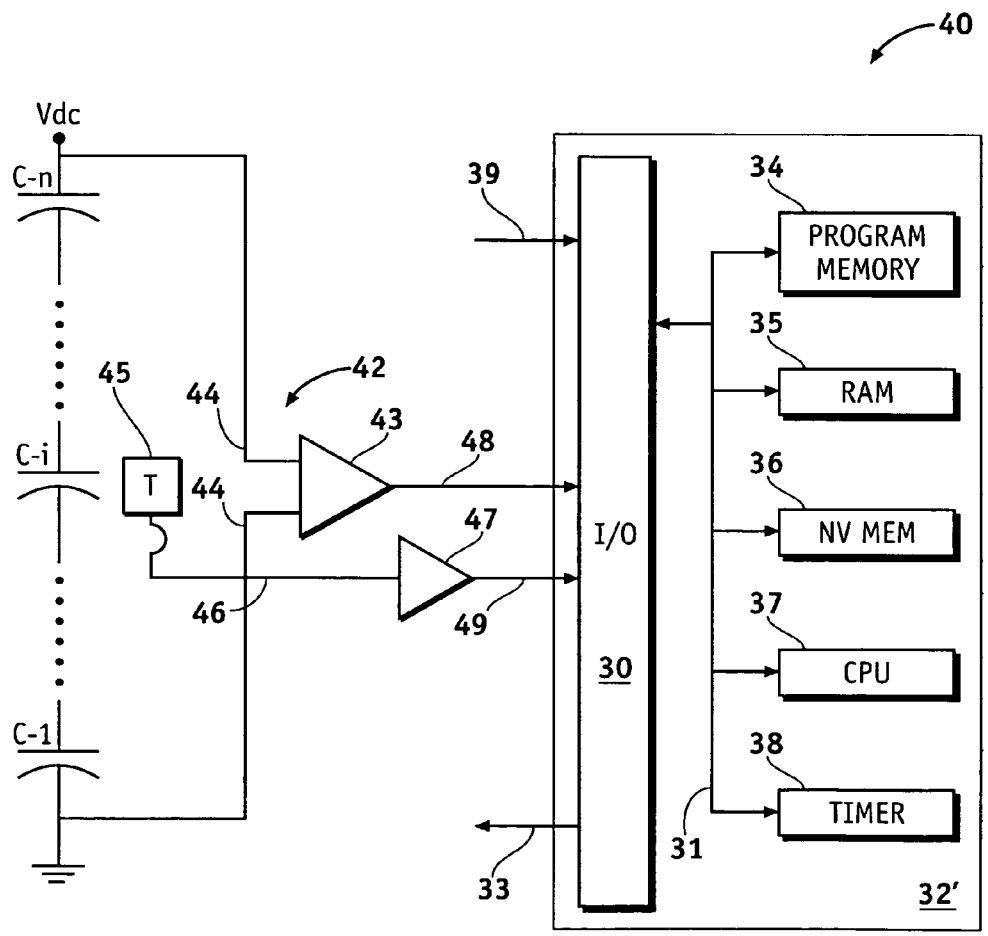
FIG. 3 is a block diagram similar to FIG. 2 but according to a further embodiment.

FIG. 3 is a block diagram similar to FIG. 2 of electrical system 40 of the present invention, but according to a further embodiment. System 40 of FIG. 3 is analogous to system 20 of FIG. 2. Systems 20 and 40 differ in that, with system 20 of FIG. 2, multiple capacitor status sensors 22 separately measure the status of the various capacitors C1 . . . C-n, which they report to measuring system 32 whereas, in system 40 of FIG. 3, single capacitor status sensor 42 measures the collective status of capacitors C1 . . . C-n in series and reports the combined data to measuring system 32'. Other than the difference in cell voltage being detected, status sensor 42 of FIG. 3 is analogous to status sensor 22 of FIG. 2 and elements 43–49 of status sensor 42 are equivalent in operation to elements 23–39 of status sensor 22, respectively, the discussion of which is incorporated herein by reference. Similarly, the elements of measuring system 32, 32' are analogous and the discussion with respect to system 32 of FIG. 2 is incorporated herein by reference. Either arrangement is useful. The discussion that follows concerning the operation of systems 20, 40 applies to either arrangement. For convenience of explanation, it is assumed that system 20 of FIG. 2 is being used and that only a single cell is being considered. Persons of skill in the art will understand based on the description herein that multiple cells may also be considered using the arrangement of system 20 or of system 40 or a combination of the two.

While an ultracapacitor is idle (e.g., OFF), no significant amount of power is being withdrawn therefrom. Nevertheless, its expected life can change in response to changes in its terminal voltage V and temperature T. While the expected life can be monitored using system 20, 40 even during idle periods, this is not desirable because of the energy drain that such monitoring requires. Accordingly, it is desirable to provide a system for correcting the expected capacitor life values based just on the V, T values at the beginning (Vo, To) and end ($V_f$, $T_f$) of the idle period and the duration ($\Delta t$) of the idle period. It is expected that the capacitor terminal voltage V(t) will decay as a function of time t during the idle period due to charge leakage. The temperature T(t) as a function of time, may increase or decrease depending upon the recent capacitor use history and the ambient temperature during the idle period. Thus, T(t) may increase or decrease during the idle period.

By way of example, assume that V(t) and T(t) decay linearly during the interval $\Delta t$. Then for any time value t during the idle (OFF) period:

$$V(t)=Vo+[(V_f-Vo)/\Delta t]t=Vo+K_V t \qquad [2]$$

$$T(t)=To+[(T_f-To)/\Delta t]t=To+K_T t \qquad [3]$$

where $K_V=[(V_f-Vo)/\Delta t]$ and $K_T=[(T_f-To)/\Delta t]$ are constants. Because of the logarithmic nature of the aging mechanisms involved, it is not possible to generate a representative life expectancy term based on just a simple averaging of the idle state beginning and end conditions. A better representation is obtained by calculating a representative integral using the idle (OFF) period start and stop conditions as end points for the integration, as follows:

$$Y_{off}=\Delta t/\int 1/[Y(V,T)]dt=\Delta t/\int [10^{-(aT(t)+bV(t)+c)}]dt. \qquad [4]$$

Substituting and combining terms yields, $$Y_{off}=\Delta t/[10^{-(aTo+bVo+c)}]\int [10^{-(aK_T+bK_V)t}]dt. \qquad [5]$$

Performing the integration over the interval $\Delta t$ yields:

$$Y_{off}=\{-[a(T_f-To)+b(V_f-Vo)]*\ln(10)\}/[1/Y_f-1/Yo] \qquad [6]$$

where $Y_f=10^{(aT_f+bV_f+c)}$ and $Yo=10^{(aTo+bVo+c)}$.

Figure 4:
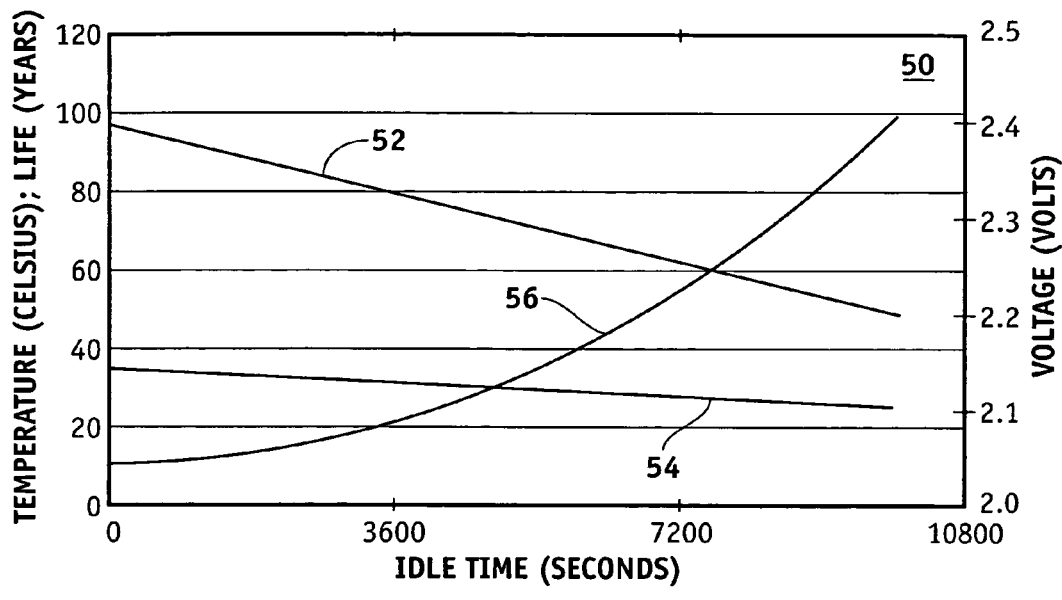
FIG. 4 shows how the average predicted life expectancy of an ultracapacitor can change during an idle (e.g., OFF) period in response to changes in capacitor voltage and temperature.

If there is no change in voltage or temperature during idle (OFF) interval $\Delta t$ or if the voltage and temperature change cancel each other (e.g., $aK_T+bK_V=0$), then $Y_{off}=Yo$, that is, the same value as when the idle (OFF) period began. It will be noted that $Y_{off} \neq (Yo+Y_f)/2$ and that $Y_{off} \neq Y(V(\Delta t/2),T(\Delta t/2))$. In other words, the average projected life expectancy value resulting from an idle period is not the simple average of the initial and final values, nor can it be found midway through the idle period. FIG. 4 shows the values of $Y_{off}$ obtained using Eq. [6] during a 10,000 second idle period, assuming a linear voltage drop of 0.2 volts and a temperature drop of 10 degrees Celsius. It will be noted that under these circumstances the life expectance increases because both decreasing voltage shown by trace 52 and decreasing temperature shown by trace 54, provide longer life as shown by trace 56.

Two time intervals need to be considered with respect to the ultracapacitor: (i) the idle or OFF time interval(s) $\Delta t$ discussed above, and (ii) the operating or ON time interval(s). During the operating ON time interval, the state of the ultracapacitor is desirably sampled every $t_s$ seconds and therefore the number n=1, 2, 3, . . . N of sampling intervals is a measure of the total run-time or ON-time. The cumulative expired life $Y_{exp}$ of the ultracapacitor is the summation of the applicable time intervals. Thus:

$$Y_{exp}=N*t_s+\Sigma \Delta t_i. \qquad [7]$$

where N is the total number of intervals $t_s$ during the ON period and $\Sigma \Delta t$ is the sum of the OFF intervals (the value of $\Delta t$ during each OFF interval may vary). $Y_{exp}$ is conveniently measured in seconds, that is, the time units associated with $t_s$ and $\Delta t$, but any other time units may also be used. The value of $Y_{exp}$ is determined by system 20, 40 of the present invention using, for example and not intended to be limiting, timer 38 as a time measuring counter or clock. Power-up or power-down signals received, for example, on line 39 (see FIGS. 2–3) from the vehicle ignition switch (not shown) identify the beginning and end of the run-periods and the idle periods.

The projected life-span $Y_{proj}$ of the ultracapacitor is determined by calculating a time weighted average of the instantaneous expected life values $Y(V,T)=Y(V(n^*t_s),T(n^*t_s))$ at each sampling interval $t_s$, plus the impact of any idle (OFF) periods, as follows:

$$Y_{proj}=Y_{exp}/\{\Sigma[t_s/Y(V(n^*t_s),T(n^*t_s))]+\Sigma(\Delta t/Y_{off})\}, \quad [8]$$

for n=1, 2, 3 to N, which can be re-written as $$Y_{proj}=Y_{exp}/\{\Sigma[t_s/Y(V(t_n),T(t_n))]+\Sigma(\Delta t/Y_{off})\}, \text{ and} \quad [9]$$

$$Y_{proj}=Y_{exp}/\{\Sigma P_n+\Sigma Q_{off}\}, \quad [10]$$

where $t_n=n^*ts$ and $$Pn=[t_s/Y(V(t_n),T(t_n))] \text{ and} \quad [11]$$

$$\Sigma Pn=\Sigma[t_s/Y(V(t_n),T(t_n))] \quad [12]$$

for each n=1, 2, 3 . . . N and $$Q_{off}=\Delta t/Y_{off} \quad [13]$$

for each OFF period of duration $\Delta t$. It will be understood that $\Delta t$ can vary for each OFF period. It is convenient to accumulate and store the intermediate quantities $$\Sigma P_n+\Sigma Q_{off}, \quad [14]$$

that is, perform the sums incrementally, rather than store the individual vales and add them up later. $Y_{proj}$ is conveniently measured in years. The expected Remaining Useful Life $Y_{rul}$ is the projected life span $Y_{proj}$ minus the expired life $Y_{exp}$, that is, $$Y_{rul}=Y_{proj}-Y_{exp}. \quad [15]$$

When $Y_{proj} > Y_{exp}$ so that $Y_{rul} > 0$, the ultracapacitor has substantially reached the end of its useful life.

Figure 5:
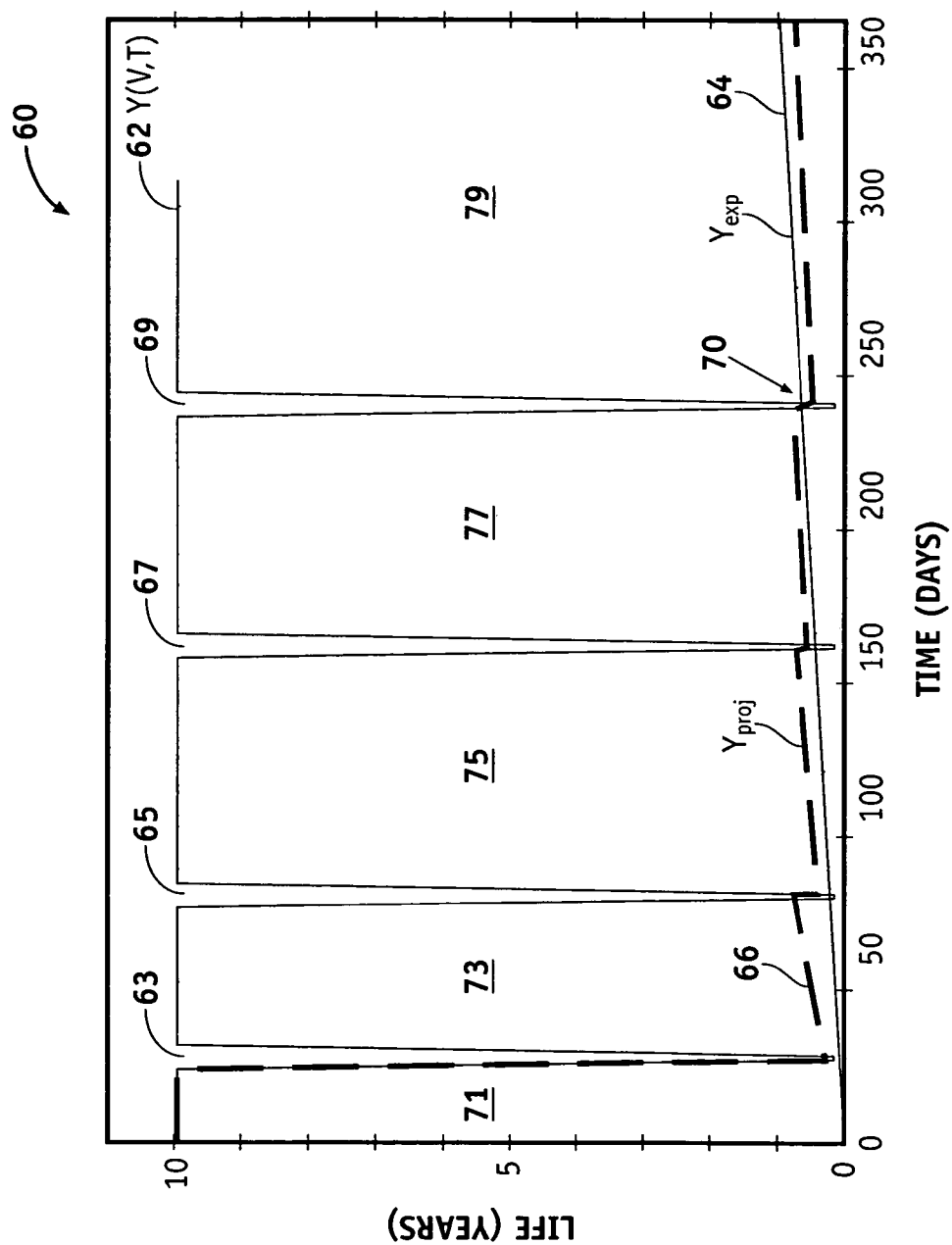
FIG. 5 is a plot of the projected life, expired life, and instantaneous predicted life of an ultracapacitor (in years) versus elapsed time (in days) when the ultracapacitor is subjected to several spaced-apart episodes (ON periods) of very severe use interspersed by idle (OFF) periods.

Measuring system 32, 32' of system 20, 40 of FIGS. 2–3 receives V(t) and T(t) values from sensors 22, 42 and t and $\Delta t$ values from timer 38 (or equivalent timers or clocks elsewhere), constants a, b, c and time interval value(s) $t_s$ from memory 34 and/or 36, N values from memory 35 and/or 36 and input 39 that receives the ON/OFF and OFF/ON transition signals, and utilizing the calculation programs stored in program memory 34 and intermediate variables stored in RAM 35 and/or NV-MEM 36, CPU 37 evaluates the above described equations to determine Y(V, T), $Y_{off}$, $Y_{proj}$, $Y_{exp}$ and $Y_{rul}$. The results of these calculations are desirably reported in whole or in part to a user status or diagnostic display or monitor (not shown) via output 33. Persons of skill in the art will understand which life values it is desirable to report to such status or diagnostic display(s) or monitor depending upon the requirements of the vehicle and/or other apparatus being powered by the ultracapacitor. An example of the results of such calculations is shown in FIG. 5. Persons of skill in the art will understand that system 20, 40 is capable of providing such information in graphical form such as in FIG. 5 or as digital read-outs or other means, depending upon the needs of the user, maintenance technician and/or monitoring system. Thus, the representation of FIG. 5 is intended to be exemplary and not limiting.

FIG. 5 shows plot 60 of the projected life $Y_{proj}$ (trace 66), expired life $Y_{exp}$ (trace 64), and instantaneous life Y(V,T) (trace 62) in years, versus elapsed time in days for an ultracapacitor subjected to several spaced-apart episodes 63, 65, 67, 69 of very severe use, interspersed with idle periods 71, 73, 75, 77, 79. For purposes of illustration it is assumed that the instantaneous life Y(V,T) is initially 10 years. The expired life $Y_{exp}$, which in the preferred embodiment is proportional to the output of one or more running counters or clocks, increases linearly from $Y_{exp}=0$ at t=0 elapsed time days, to $Y_{exp}=1$ year on the ordinate for t=365 elapsed time days on the abscissa. At the times indicated by reference numbers 63, 65, 67, 69 the ultracapacitor is switched ON under conditions where Y(V,T) drops from 10 years to 0.01 years for a period of one day and then returns to 10 years. This corresponds to very severe usage, much greater than what is likely to be encountered in normal use of an ultracapacitor, but which serves as a convenient way of illustrating how the projected life $Y_{proj}$ change with time under a combination of hard use (ON) periods separate by idle (OFF) periods. On plot 60, the lateral spacings of traces 62 where Y(V,T) drops very sharply for one day from 10 years to 0.01 years and back to 10 years have been exaggerated so that the change in Y(V,T) is easily seen. During intervening OFF time periods 71, 73, 75, 77, 79 the ultracapacitor is idle and Y(V,T) is assumed to be constant at 10 years.

Projected life $Y_{proj}$ shown by trace 66 is initially at 10 years at elapsed time t=0 and during idle (OFF) period 71. But, when first severe usage (ON) event 63 occurs for one day, $Y_{proj}$ drops sharply, approximately in concert with Y(V,T) but not as far. At the end of first one-day ON period 63 and the beginning of idle period 73, Y(V,T) returns to 10 years. $Y_{proj}$ recovers slightly during idle (OFF) period 73 but still remains less than one year. When second severe usage one-day (ON) event 65 occurs and Y(V,T) again drops to 0.01 years for one day, $Y_{proj}$ falls again and then partially recovers during subsequent idle (OFF) period 75. This trend of sharp drop and partial recovery continues with third severe usage one-day (ON) event 67 and subsequent idle (OFF) period 77, each fall bringing trace 66 closer to linearly increasing values of $Y_{exp}$ shown by trace 64. With fourth severe usage one-day (ON) event 69, $Y_{proj}$ trace 66 falls below $Y_{exp}$ trace 64 indicating that the projected life is now less than the expended life and the ultracapacitor has reached its end-of-life state, e.g., the remaining useful life $Y_{rul} > 0$. At this point system 20, 40 desirably reports this condition via output 33. Persons of skill in the art will also understand that system 20, 40 can report any of the intermediate values desired by the user, maintenance person and/or monitoring system (not shown) and operation of the system is not limited merely reporting $Y_{rul} > 0$. Further, NV-MEM 36 can be used to store information on the various ON and OFF periods and the changes in life that occur as a result, for later retrieval by the user or a maintenance person or a monitoring system for system performance evaluation. This is a particular feature of the present invention. For example, and not intended to be limiting, an average Y(V,T) during the ON period can be determined by periodically determining and storing a summation of instantaneous values of Y(V,T) in RAM 35 and then dividing by the number of samples collected. This gives information on the effect that a user's drive schedule and charge/discharge strategy has on the ultracapacitor useful life expectancy. Persons of skill in the art will understand based on the description herein how to gather and store this and other types of useful data concerning the ultracapacitor usage and changes in remaining life. The operation of system 20, 40 will be more fully understood in connection with the flow chart presented in FIG. 6.

FIG. 6 is a simplified flow chart illustrating method 100 of the present invention according to a preferred embodiment. The abbreviation "N" is used in FIG. 6 to indicate a negative "NO" or "FALSE" outcome from a query, the abbreviation "Y" is used to indicate a positive "YES" or "TRUE" outcome to a query, the abbreviation "ON" is used to indicate the state where significant power is being withdrawn from the ultracapacitor, and the abbreviation "OFF" is used to indicate the state where no significant power is being withdrawn from the ultracapacitor. Further, it is assumed for convenience of description that the voltage and temperature parameters of the ultracapacitor are being sampled every ts seconds, but this is not intended to be limiting. Thus, time t is conveniently measured in units of $t_s$, so that $t=n*t_s$ where n=1, 2, 3, ... N. To distinguish between OFF time intervals and ON time intervals, the notation $n_{off}$ or $n_{on}$ is used respectively. However, this is not intended to be limiting and any sampling interval or time measuring interval may be used. A convenient value of $t_s$ is about one seconds.

Method 100 ordinarily begins with START 102 whereby system 20, 40 is in a readiness state able to measure capacitor voltage V and temperature T on system power-up. For first time initialization and following a forced reset, the following start-up parameter values are used: Power State=ON, n=0, $N_p$=0, $\Sigma\Delta t$=0, $\Sigma Q_{off}$=0, $\Sigma P_n$=0, $V_o$=current value of V, $T_o$=current value of T and EOL=FALSE. Following initialization, method 100 runs substantially continuously as long as power is provided to system 20, 40. The following description assumes that initialization has already occurred and that method 100 is cycling from START 102 to RETURN 142 and back to START 102.

In step 104, counter or timer 31 is incremented, that is n is conveniently but not essentially set equal to n+1. Then query 106 is executed wherein the power state of the system is determined, that is, is ultracapacitor C in an ON state or an OFF state. If the outcome of query 106 is ON, then in query 108 it is determined whether or not capacitor C is changing state from ON to OFF or not. If the outcome of query 106 is OFF, then query 110 is executed wherein it is determined whether or not capacitor C is changing state from OFF to ON. (The signal appearing on input 39 of system 20, 40 indicates the direction of a state change, e.g., ON to OFF or OFF to ON.) Method 100 may be divided into four general paths or sequence of steps 111, 131, 145, 147 for different circumstances. Path 111 comprising steps 112, 114, 116, 118, 120, 122, 124, 126, 128, 130, 132, 138, 140 and 142, deals with the case where the system is initially OFF but is changing from OFF to ON. Path 131 comprising steps 144, 130, 132, 138, 140 and 142, deals with the case where the system is initially ON and continues to stay ON (i.e., ON to OFF query 108 yields NO (FALSE)). Path 145 comprising steps 146, 148, 150 and 142, deals with the case where the system is initially ON but is changing from ON to OFF (query 106 yields YES (TRUE)). Path 147 corresponds to the situation where capacitor C is OFF and not changing state (query 110 yields NO (FALSE)).

Returning now to query 110, if the outcome of query 110 is NO (FALSE), then method 100 proceeds via (A) to RETURN 142. RETURN 142 indicates that method 100 recycles to start 102 as long as power is present to operate system 20, 40, otherwise system 20, 40 pauses at step 142. If the outcome of query 110 is YES (TRUE), indicating that a state change from OFF to ON is occurring or about to occur, then method 100 proceeds to step 112, wherein the power state in control system 20, 40 is set to ON and to step 114 wherein values of $\Sigma Q_{off}$, $\Sigma\Delta t$, $N_p$, $\Sigma P_n$, $V_o$, $T_o$ stored in step 148 and corresponding to the parameter values at the beginning of the now ending OFF interval are retrieved in system 20, 40. In step 116, the current value of $\Delta t=(n_{off})*t_s$ and the current values of Vf, Tf associated with the end of the current OFF period (brought about by the OFF to ON transition associated with query 110) are determined. In step 118 the parameters $K_V$, $K_T$ (see Eqs. [2]–[3] and associated text) are determined.

In query 120 it is determined whether or not the changes in V(t) and T(t) during the OFF-interval are self-canceling (i.e., is query 120 TRUE). If the outcome of query 120 is YES (TRUE), then in step 122, the value $Y_{off}$ of Y(t) at the end of the just ended OFF period is set equal to $Y(V_o,T_o)$, which is, the Y(t)=Y(V(t),T(t)) value at the beginning of the just ended OFF period. If the outcome of query 120 is NO (FALSE) then method 100 proceeds to step 124 wherein the values of $Y_o$, $Y_f$ and $Y_{off}$ are determined. The alternate outcomes of steps 122 or 124 are fed to step 126, wherein the values of $\Sigma Q_{off}$, $\Sigma\Delta t$ and N are determined as indicated. Having already used the values of $n_{off}$ (which measures the length $\Delta t$ of the just ended OFF period), $n_{off}$ is reset to zero in step 128, in preparation of another iteration of method 100. In subsequent step 130 the values of $Y_{exp}$, $Y_{proj}$ and $Y_{rul}$ are determined as indicated and to answer query 132. If the outcome of query 132 is YES (TRUE) indicating that $Y_{rul}$ is zero or negative and that the capacitor end-of-life (EOL) condition has been reached, this is reported in EOL=TRUE step 140 and then method 100 proceeds to END step 144. If the outcome of query 132 is NO (FALSE) indicating that the end-of-life condition has not yet been reached, then this situation is reported in EOL=FALSE step 138 and method 100 proceeds to RETURN 142.

Returning now to query 108 and steps 131 wherein the capacitor is ON and is remaining ON, then in step 144, $t_n$, $Y_n$, $\Sigma P_n$ and N are determined as indicated, where n=$n_{on}$ provides a measure of the current ON time. For compactness of representation, in FIG. 6 $Y(t_n)=Y(V(t_n),T(t_n))$ of Eqs. [9]–[12]. The values of $t_n$, $Y_n$, $\Sigma P_n$ and N determined in step 144 are used in subsequent step 130 to determine $Y_{exp}$, $Y_{proj}$ and $Y_{rul}$. $Y_{rul}$ is then fed to query 132. Query 132 and steps 138 or 140 are carried out as already described and method 100 proceeds to END 144 where EOL=TRUE and to RETURN 142 (recycles to start 102) where EOL=FALSE. It will be noted that in connection with steps 131, n is not reset as it is in connection with steps 111, 145.

Returning again to query 108 and steps 145 where the capacitor is initially ON but making or about to make an ON to OFF transition (output of query 108 is YES (TRUE). In subsequent step 146, the power state of measuring system 20, 40 is set to OFF and in step 148 various values $\Sigma Q_{off}$, $\Sigma\Delta t$, $N_p$, $\Sigma P_n$, $V_o$, $T_o$ associated with the beginning of the new OFF period are stored, as for example in NV-MEM 36 or elsewhere. In subsequent step 150, n=$n_{on}$ is set to zero and method 100 advances to RETURN step 102 for the next iteration of method 100. Timer 38 is convenient for determining $t=n*t_s$, but any suitable timer or timing function may also be used. A software timer is a non-limiting example of alternative means for providing a timing function.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A system for projecting the useful life $Y_{proj}$ of an ultracapacitor power source undergoing at least one ON period and at least one OFF period, comprising:
   sensors coupled to the ultracapacitor power source for measuring the voltage V(t) and temperature T(t) thereof as a function of time; and
   a measuring system coupled to the sensors, the measuring system receiving voltage V(t), and temperature T(t) and computing useful life $Y_{proj}$ based at least in part on initial values of voltage V(t), and temperature T(t)=Vo, To at the beginning of an OFF period of the ultracapacitor, final values of voltage V(t), and temperature T(t)=$V_f$, $T_f$ at the end of the OFF period and one or more values of V(t), T(t) obtained during an ON period of the ultracapacitor.

2. The system of claim 1 wherein the OFF period has a duration $\Delta t$ and during the at least one ON period, V(t), T(t) are sampled at one or more predetermined time intervals $t_s$.

3. The system of claim 2 wherein the measuring circuitry determines $Y_{proj}$ by evaluating equations of the form:

$$Y_{proj}=(N\,t_s+\Sigma\Delta t)/\{\Sigma[t_s/Y(V(n^*t_s),T(n^*t_s))]+\Sigma\Delta t/Y_{off}\},$$
and $$Y_{off}=\{-[a(T_f-T_o)+b(V_f-V_o)]^*\ln(10)\}/[1/Y_f-1/Y_o]\text{and}$$

$$Y_f=10^{(aT_f+bV_f+c)}, \text{ and}$$

$$Y_o=10^{(aT_o+bV_o+c)}, \text{ and}$$

$$Y(V,T)=10^{(aT+bV+c)} \text{ where } a, b, \text{ and } c \text{ are constants,}$$
and $n=1, 2, 3 \ldots N$.

4. The system of claim 1 wherein the one or more values of V(t), T(t) obtained during the ON period are obtained at predetermined time intervals $t_s$.

5. The system of claim 1 wherein the one or more values of V(t), T(t) obtained during an ON period are sampled at time intervals $n^*t_s$ where $n=1, 2, 3, \ldots N$.

6. The system of claim 5 wherein N is the largest value of n reached prior to the end of the current ON period.

7. A system for projecting the useful life $Y_{proj}$ of an ultracapacitor power source undergoing at least one ON period after an OFF period, comprising:
   sensors coupled to the ultracapacitor power source for measuring the voltage V(t) and temperature T(t) thereof as a function of time t; and
   a measuring system coupled to the sensors, the measuring system receiving V(t), T(t) and computing $Y_{proj}$ based at least in part on combining values of the instantaneous ultracapacitor life computed as a function of both the voltage and temperature for different values of t during the ON period, and wherein $Y_{proj}$ further depends at least in part upon the V,T values $V_o,T_o$ at the beginning of the OFF interval and the V(t) and T(t) values $V_f,T_f$ at the end of the OFF interval.

8. The system of claim 7 wherein the different values of t during the ON period comprise $t=n^*t_s$ where $n=1, 2, 3, \ldots N$, where N is the largest value of n occurring during the ON period.

9. The system of claim 7 wherein $Y_{proj}=f(V_o,V_f,T_o,T_f)$.

10. A method of determining a projected life $Y_{proj}$ of an ultracapacitor utilizing its measured voltage V(t) and measured temperature T(t), comprising:
    storing values of V(t),T(t) for at least two time values $t=t_1$ and $t=t_2$ at the beginning and end of an OFF period of the ultracapacitor, respectively;
    determining the instantaneous life of the ultracapacitor $Y(V(t),T(t))=10^{(aT(t)+bV(t)+c)}$ where a, b, and c are constants, for the least two time values $t=t_1$ and $t=t_2$, and combining the values of $Y_1(V(t_1),T(t_1))$ and $Y_2(V(t_2),T(t_2))$ obtained thereby to at least in part, obtain $Y_{proj}$.

11. The method of claim 10 further comprising calculating the expired life $Y_{exp}$ of the ultracapacitor proportional to elapsed time, then determining whether $Y_{proj}\leq Y_{exp}$.

12. The method of claim 11 further comprising, if $Y_{proj}\leq Y_{exp}$ is TRUE, then reporting that the ultracapacitor has reached its end-of-life.

13. The method of claim 11 wherein $Y_{proj}=f(Y_{exp}/[P_n+Q_{off}])$ where $P_n=[t_s/Y(t_n)]$ and $t_n=n^*ts$ for $n=1, 2, 3, \ldots N$ during an ON state, and $Q_{off}=f(\Delta t, V_o, T_o, V_f, T_f)$ where $\Delta t$ is the elapsed time in a prior OFF state and $V_o$, $T_o$ and $V_f$, $T_f$ are the values of V(t), T(t) at the beginning and end of the prior OFF state, respectively.

* * * * *